United States Patent
Lee et al.

(10) Patent No.: US 10,796,817 B2
(45) Date of Patent: Oct. 6, 2020

(54) ALUMINUM PATTERN AND METHOD FOR MANUFACTURING SAME

(71) Applicant: LG CHEM, LTD., Seoul (KR)

(72) Inventors: Donghyun Lee, Daejeon (KR); Seung Heon Lee, Daejeon (KR); Song Ho Jang, Daejeon (KR); Jiehyun Seong, Daejeon (KR); Chang Yoon Lim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/502,326

(22) PCT Filed: Aug. 11, 2015

(86) PCT No.: PCT/KR2015/008390
§ 371 (c)(1),
(2) Date: Feb. 7, 2017

(87) PCT Pub. No.: WO2016/024787
PCT Pub. Date: Feb. 18, 2016

(65) Prior Publication Data
US 2017/0229209 A1 Aug. 10, 2017

(30) Foreign Application Priority Data
Aug. 11, 2014 (KR) .................. 10-2014-0103910

(51) Int. Cl.
| | |
|---|---|
| *H01B 5/14* | (2006.01) |
| *H01L 31/18* | (2006.01) |
| *C01F 7/02* | (2006.01) |
| *G09F 9/00* | (2006.01) |

(52) U.S. Cl.
CPC .............. *H01B 5/14* (2013.01); *C01F 7/02* (2013.01); *G09F 9/00* (2013.01); *H01L 31/1884* (2013.01); *Y02E 10/50* (2013.01)

(58) Field of Classification Search
CPC .............. C01F 7/02; G09F 9/00; H01B 5/14
See application file for complete search history.

(56) References Cited

U.S. PATENT DOCUMENTS

| | | | | |
|---|---|---|---|---|
| 3,846,540 | A * | 11/1974 | Leach ................ | C01F 7/02 264/211 |
| 8,299,692 | B2 * | 10/2012 | Lee .................... | H01L 33/486 257/99 |
| 2008/0100217 | A1 | 5/2008 | Hwang et al. | |
| 2008/0137025 | A1 * | 6/2008 | Ueda ................. | G02F 1/1303 349/155 |

(Continued)

FOREIGN PATENT DOCUMENTS

| | | |
|---|---|---|
| CN | 103309510 A | 9/2013 |
| JP | 04-103132 A | 4/1992 |

(Continued)

OTHER PUBLICATIONS

Office Action issued by the Japanese Patent Office in Appl'n No. 2017-504137, dated Oct. 30, 2018.

*Primary Examiner* — Joseph L Williams
*Assistant Examiner* — Jacob R Stern
(74) *Attorney, Agent, or Firm* — Dentons US LLP

(57) ABSTRACT

The present specification relates to a method for manufacturing a fine aluminum pattern, an aluminum pattern manufactured by the manufacturing method, and a conductive film including the same.

5 Claims, 3 Drawing Sheets

(56) References Cited

U.S. PATENT DOCUMENTS

2012/0031746 A1\* 2/2012 Hwang .................. G06F 3/041
200/5 A

FOREIGN PATENT DOCUMENTS

| | | |
|---|---|---|
| JP | 05-152444 A | 6/1993 |
| JP | 05-232734 A | 9/1993 |
| JP | 06-005859 A | 1/1994 |
| JP | 07-201821 A | 8/1995 |
| JP | 07-295241 A | 11/1995 |
| JP | 2000-314897 A | 11/2000 |
| JP | 2006-310482 A | 11/2006 |
| KR | 10-2008-0039564 A | 5/2008 |
| WO | 2013/146750 A1 | 10/2013 |

\* cited by examiner

[Figure 1]
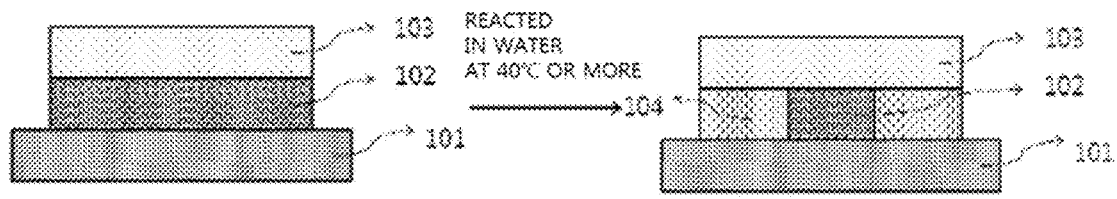
[Figure 2]
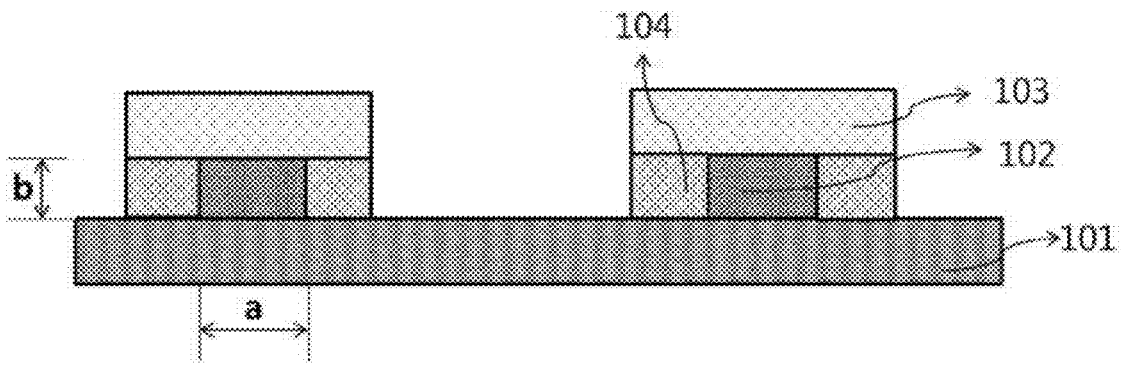

[Figure 3]
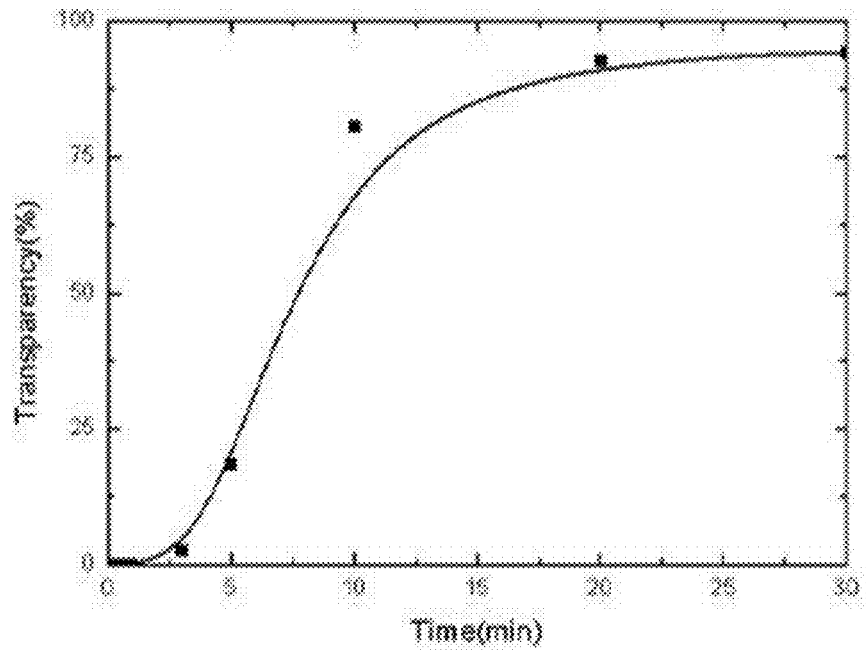
| TIME | TRANSMITTANCE | PHOTOGRAPH |
|------|---------------|------------|
| 0    | 0             |            |
| 5    | 18.4          |            |
| 10   | 80.5          |            |
| 20   | 92.7          |            |

[Figure 4]
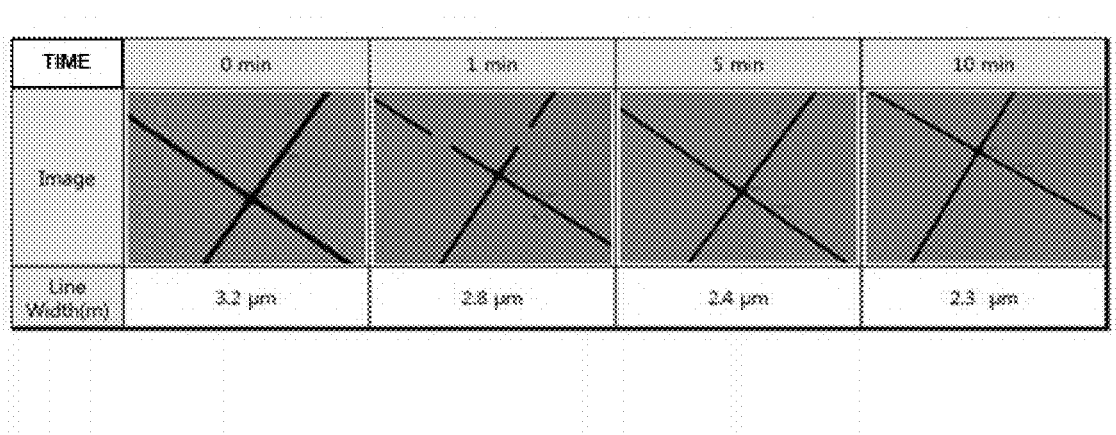

US 10,796,817 B2

ALUMINUM PATTERN AND METHOD FOR MANUFACTURING SAME

This application is a National Stage Entry of International Application No. PCT/KR2015/008390, filed Aug. 11, 2015, and claims the benefit of and priority to Korean Application No. 10-2014-0103910, filed Aug. 11, 2014, all of which are hereby incorporated by reference in their entirety for all purposes as if fully set forth herein.

TECHNICAL FIELD

The present specification claims priority to and the benefit of Korean Patent Application No. 10-2014-0103910 filed in the Korean Intellectual Property Office on Aug. 11, 2014, the entire contents of which are incorporated herein by reference.

The present specification relates to a method for manufacturing a fine aluminum pattern and an aluminum pattern manufactured by the manufacturing method.

BACKGROUND ART

A transparent conductive film has been used as a liquid crystal device, an electronic ink device, a transparent electrode of a display such as PDP, LCD, and OLED or an illumination device, or the like. Meanwhile, as interests have been recently focused on solar cells, the transparent conductive film has also been used for solar cells requiring light transmittance and conductive effects.

In general, the transparent conductive film is manufactured by laminating a metal oxide such as ITO on a transparent substrate. An ITO included in the transparent conductive film serves as a transparent material. However, display devices and the like have a tendency to have a large area, and electrodes using the existing ITO have a problem in that the sheet resistance is increased.

Further, methods using metal patterns have an advantage in that the costs are lower and the resistance is lower than methods using the existing ITO films, but have a limitation in that the light transmittances are lower than those of the existing ITO films, and touch patterns are faintly visible.

Therefore, attempts to implement a fine metal pattern have been made in order to alleviate the limitation.

DETAILED DESCRIPTION OF THE INVENTION

Technical Problem

An object of the present specification is to provide a method for manufacturing a fine aluminum pattern and an aluminum pattern manufactured by the manufacturing method.

Technical Solution

The present specification provides a method for manufacturing an aluminum pattern, the method including: forming an aluminum pattern on a substrate; and forming aluminum oxide on at least a portion of the aluminum pattern by immersing the aluminum pattern in water.

Further, the present specification provides an aluminum pattern manufactured by the above-described method for manufacturing an aluminum pattern, the aluminum pattern including: a substrate; an aluminum pattern disposed on the substrate; and aluminum oxide disposed on at least a portion of side surfaces of the aluminum pattern.

The present specification provides a conductive film including the aluminum pattern.

In addition, the present specification provides a display device including the conductive film.

Advantageous Effects

An aluminum pattern including a fine line width can be implemented by a manufacturing method according to an exemplary embodiment of the present specification.

Furthermore, the manufacturing method is a relatively simple manufacturing method, and is economically efficient in terms of process time and/or costs because there is no need for manufacturing a separate mask or printing plate.

BRIEF DESCRIPTION OF DRAWINGS

FIG. 1 is a view illustrating an example of manufacturing an aluminum pattern according to an exemplary embodiment of the present specification.

FIG. 2 is a view exemplifying a side surface structure of an aluminum pattern according to an exemplary embodiment of the present specification.

FIG. 3 is a view illustrating the transparency of an aluminum pattern over the time when the aluminum pattern is immersed in water.

FIG. 4 is a view illustrating the line width of an aluminum pattern over the time when the aluminum pattern is immersed in water.

EXPLANATION OF REFERENCE NUMERALS AND SYMBOLS

101: Substrate
102: Aluminum pattern
103: Resist layer
104: Aluminum oxide
a: Line width of aluminum pattern
b: Thickness of pattern

BEST MODE

Hereinafter, the present specification will be described in more detail.

When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element may be further included.

The present specification provides a method for manufacturing an aluminum pattern, the method including: forming an aluminum pattern on a substrate; and forming aluminum oxide on at least a portion of the aluminum pattern by immersing the aluminum pattern in water.

When an aluminum pattern including a metal is implemented in the related art, it is not easy to additionally decrease a line width of a pattern once constituted.

In an exemplary embodiment of the present specification, in the forming of the aluminum oxide by immersing the aluminum pattern in water, aluminum oxide is produced from a surface of the aluminum pattern which is brought into contact with water.

The aluminum oxide has high transmittance and thus may make an opaque aluminum pattern thin film transparent, thereby decreasing the line width of the opaque aluminum pattern. Further, a range in which aluminum oxide is produced may be adjusted according to a reaction time and a water temperature, and in this case, the line width of the aluminum pattern may be adjusted according to the selection by a person skilled in the art.

A method for manufacturing an aluminum pattern according to an exemplary embodiment of the present specification includes the aluminum pattern by immersing the aluminum pattern in water, and thus may easily decrease the line width of a pattern constituted by a simple process without manufacturing a separate mask or manufacturing a printing plate, and the line width may be adjusted, if necessary, by adjusting the time for immersing the aluminum pattern in water and the water temperature, and accordingly, the method is effective in terms of costs and time.

In an exemplary embodiment of the present specification, the manufacturing method further includes forming a resist layer on the aluminum pattern after the forming of the aluminum pattern and before the forming of the aluminum oxide.

The resist layer serves to prevent the aluminum pattern from being lost when aluminum oxide is formed by immersing the aluminum pattern in water, and as a material for the resist layer, it is possible to use a water-insoluble polymer and/or single molecule commonly used in the art.

In an exemplary embodiment of the present specification, the resist layer may use a method generally used. Specifically, it is possible to use a vacuum process such as a sputtering method, a chemical vapor deposition (CVD) method, a thermal evaporation method, and an e-beam deposition method, or a printing process such as screen printing, inkjet printing, offset printing, or gravure printing, and the method is not limited thereto.

In an exemplary embodiment of the present specification, the forming of the resist layer on the aluminum pattern is for selectively forming aluminum oxide only on the side surfaces of the aluminum pattern, preventing aluminum oxide having low conductivity from being formed on an upper surface of the aluminum pattern, and thus facilitating a role as an electrode when the aluminum pattern is applied to a device. Therefore, in this case, the thickness of the aluminum pattern is not changed.

In an exemplary embodiment of the present specification, the forming of the aluminum pattern may use a method generally used in forming a metal pattern. The pattern may use a printing method, a photolithography method, a photography method, a method using a mask, or laser transfer, and the like, and the method is not limited thereto.

In an exemplary embodiment of the present specification, the aluminum pattern has a thickness of more than 0 µm and 10 µm. In one exemplary embodiment, the aluminum pattern has a thickness of 150 nm to 200 nm. The thickness of the aluminum pattern may be adjusted by the person skilled in the art, if necessary.

In the present specification, the thickness of the aluminum pattern means a width between one surface on which aluminum oxide is not formed and another surface to face the one surface. In FIG. 2, the width at the b portion corresponds to the thickness of the aluminum pattern.

In an exemplary embodiment of the present specification, the thickness of the aluminum oxide may be the same as that of the aluminum pattern.

In an exemplary embodiment of the present specification, the aluminum pattern is a mesh pattern. The mesh pattern may include a regular polygonal pattern including one or more forms of a triangle, a quadrilateral, a pentagon, a hexagon, and an octagon.

In an exemplary embodiment of the present specification, a pitch of the aluminum pattern before being immersed in water may be 50 µm to 500 µm, but is not limited thereto and may be adjusted by the person skilled in the art, if necessary.

In the present specification, the pitch of the aluminum pattern means a width between patterns, and means a width between a middle of the n-th pattern and a middle of the n+1-th pattern.

Since aluminum oxide is produced from a portion brought into contact with water in the aluminum pattern, the pitch of the aluminum pattern after being immersed in water is not changed.

In one exemplary embodiment, the aluminum pattern on which the aluminum oxide pattern is formed has a transmittance of 80% or more and less than 100%.

In an exemplary embodiment of the present specification, the transmittance of the aluminum pattern after being immersed in water is increased by 10% to 50% compared to that of the aluminum pattern before being immersed in water.

In an exemplary embodiment of the present specification, in the forming of the aluminum oxide by immersing the aluminum pattern in water, a water temperature is 40° C. to 100° C.

Within the temperature range, the aluminum oxide is economically efficient in terms of time and/or costs. Specifically, when the aluminum pattern is immersed in water at less than 40° C., the aluminum oxide is slowly produced, so that the treatment time may be increased.

FIG. 1 is a view illustrating an example of manufacturing an aluminum pattern according to an exemplary embodiment of the present specification. An aluminum pattern 102 is formed on a substrate 101, and a resist layer 103 is formed on the aluminum pattern. Thereafter, when a reaction is carried out in water at 40° C. or more, aluminum oxide 104 is formed from a surface of the aluminum pattern which is brought into contact with water.

In an exemplary embodiment of the present specification, the aluminum pattern is immersed in water for 30 minutes or less. In an exemplary embodiment of the present specification, the aluminum pattern is immersed in water for 5 minutes to 30 minutes. The time for immersing the aluminum pattern may be adjusted according to the water temperature and/or the line width of the pattern.

When an aluminum pattern is immersed in water at 40° C. to 100° C. as described above, the transmittance is increased due to the formation of aluminum oxide, and when the time for immersing the aluminum pattern is 30 minutes or less, it is possible to prevent the aluminum pattern from being short-circuited due to the formation of the aluminum oxide in excess.

In an exemplary embodiment of the present specification, the water temperature is 40° C. to 100° C., and after the oxidizing of the aluminum pattern by immersing the aluminum pattern in water, the transmittance of the aluminum pattern is increased by 18% or more within 5 minutes.

FIG. 3 is a view illustrating the transparency of an aluminum pattern over the time when the aluminum pattern is immersed in water. In FIG. 3, as a result of observing the transparency, it can be confirmed that the transmittance is improved by 18.4% within 5 minutes, and from 5 minutes later, letters are visible due to high transparency.

In another exemplary embodiment, after the forming of the aluminum oxide by immersing the aluminum pattern in water, the transmittance of the aluminum pattern is increased by 90% or more within 20 minutes.

In an exemplary embodiment of the present specification, the water temperature is 40° C. to 100° C., and after the oxidizing of the aluminum pattern by immersing the aluminum pattern in water, the line width of the aluminum pattern is increased by 10% to 30% within 5 minutes.

FIG. 4 is a view illustrating the line width of an aluminum pattern over the time when the aluminum pattern is immersed in water. As a result of observing the line width of the aluminum pattern in FIG. 4, it can be confirmed that the line width is decreased from 3.2 μm to 2.4 μm within 5 minutes.

In an exemplary embodiment of the present specification, the line width of the aluminum pattern means a width between one surface of the aluminum pattern brought into contact with aluminum oxide and another surface of the aluminum pattern to face the one surface. In FIG. 2, the width at the a portion corresponds to the line width of the aluminum pattern.

Further, the present specification provides an aluminum pattern manufactured by the above-described method for manufacturing an aluminum pattern, the aluminum pattern including: a substrate; an aluminum pattern disposed on the substrate; and aluminum oxide disposed on at least a portion of side surfaces of the aluminum pattern.

The present specification provides an aluminum pattern including: a substrate; an aluminum pattern disposed on the substrate; and aluminum oxide disposed on at least a portion of side surfaces of the aluminum pattern.

In the present specification, examples of the aluminum oxide include $Al_2O_3$, $Al(OH)_3$, $AlO(OH)$, and the like, and the aluminum oxide may vary depending on the degree of oxidation of aluminum.

In an exemplary embodiment of the present specification, the aluminum oxide has a transmittance of 80% to 100%. When the aluminum pattern includes the aluminum oxide within the aforementioned range, touch patterns may be invisible when the aluminum pattern is applied to a device.

In another exemplary embodiment, the aluminum pattern has a line width of 10 μm or less. When the aluminum pattern is applied to a device within the aforementioned range, the pattern may be invisible. Specifically, the aluminum pattern according to one exemplary embodiment has a line width of 2 μm to 5 μm.

The line width of aluminum means that the line width of aluminum oxide is excluded from the line width of the initial aluminum pattern. In FIG. 2, the width at the a portion corresponds to the line width of the aluminum pattern of the specification.

The present specification provides a conductive film including the above-described aluminum pattern.

Further, the present specification provides a display device including the conductive film. According to an exemplary embodiment of the present specification, the conductive film can be applied to all the fields in which transparent electrodes are currently used, and may be used particularly for touch screens such as PDAs, laptop computers, ATMs, mobile phones, and navigation systems. In addition, the conductive film may also be used for display devices such as OLED display panels, liquid crystal displays (LCDs), cathode-ray tubes (CRTs), and PDPs, or OLED illumination, and the like.

An exemplary embodiment of the present specification provides a touch screen including the above-described conductive film.

In an exemplary embodiment of the present specification, at least one surface of the aluminum pattern further includes a darkened layer. In an exemplary embodiment of the present specification, the darkened layer may be patterned. In the present specification, the darkened layer serves to, in a touch screen including a fine metal pattern disposed on an effective screen part, improve light reflection and diffraction of the fine metal pattern.

In an exemplary embodiment of the present specification, the touch screen may further include an electrode part or a pad part in addition to the effective screen part on which an aluminum pattern is formed on the upper portion of a base material, and in this case, the effective screen part and the electrode part/the pad part may be composed of the same conductor, and have the same thickness and thus may not have a joint thereof.

In an exemplary embodiment of the present specification, the touch screen may include a protective film, a polarization film, an anti-reflective film, an anti-glare film, an anti-fingerprinting film, a low reflective film, and the like on a surface of each base material.

In an exemplary embodiment of the present specification, the touch screen includes the manufactured aluminum pattern. For example, in a capacitive touch screen, the conductive substrate according to an exemplary embodiment of the present invention may be used as a touch-sensitive electrode substrate.

The touch screen according to an exemplary embodiment of the present specification may include: a lower base material; an upper base material; and an electrode layer disposed on either or both of a surface of the lower base material brought into contact with the upper base material and a surface of the upper base material brought into contact with the lower base material. The electrode layer may serve to transmit and receive signals for detecting an X-axis position and for detecting a y-axis position. The electrode layer may include the aluminum pattern according to an exemplary embodiment of the present specification.

When an electrode layer is included on both of one surface of the upper base material and one surface of the lower base material so that an electrode layer having two layers is formed, an insulation layer or a spacer may be disposed between the lower base material and the upper base material, such that the interval between the electrode layers is constantly maintained and the connection is not formed. The insulation layer may include an adhesive or a UV or thermally curable resin.

The touch screen may further include a ground part connected with the above-described aluminum pattern. For example, the ground part may be formed at an edge of the surface of the base material on which the aluminum pattern is formed. Further, at least one of the anti-reflective film, the polarization film, and the anti-fingerprinting film may be disposed on at least one surface of a laminate including the aluminum pattern. According to a design specification, different kinds of functional films in addition to the above-described functional films may be further included.

MODE FOR INVENTION

Hereinafter, the present specification will be described in detail with reference to Examples for specifically describing the present specification. However, the Examples according to the present specification may be modified in various forms, and it is not interpreted that the scope of the present specification is limited to the Examples described below in detail. The Examples of the present specification are provided for more completely explaining the present specification to the person with ordinary skill in the art.

Example 1

A pattern was formed through a reverse offset printing, and an aluminum pattern with a line width of 3.2 μm and a pitch of 300 μm was formed through an etching process. The formed aluminum pattern was immersed in distilled water (DI water) at 100° C.

Based on the Example, the line width over the immersion time is described in the following Table 1.

TABLE 1

| Time (min) | Line width (μm) |
|---|---|
| 0 | 3.2 |
| 1 | 2.8 |
| 5 | 2.4 |
| 10 | 2.3 |

From the result of Table 1, it can be confirmed that when the aluminum pattern is immersed in water, the line width of a fine aluminum pattern may be obtained.

The invention claimed is:

1. A method for manufacturing a conductive film for transparent electrodes, the conductive film comprising an aluminum pattern, wherein the method comprises, in this order:

forming the aluminum pattern on a substrate;

forming a resist layer on the aluminum pattern; and forming aluminum oxide on at least a portion of side surfaces of the aluminum pattern not covered by the resist layer by immersing the aluminum pattern in water, wherein a pitch of the aluminum pattern before being immersed in water is from 50 μm to 500 μm, wherein the aluminum pattern has an initial line width of 10 μm or less, and wherein a transmittance of the aluminum pattern is 80% to 100%.

2. The method of claim 1, wherein a water temperature is 40° C. to 100° C.

3. The method of claim 1, wherein a transmittance of the aluminum pattern after being immersed in water is increased by 10% to 50% compared to a transmittance of the aluminum pattern before being immersed in water.

4. The method of claim 1, wherein the water temperature is 40° C. to 100° C., and after the forming of the aluminum oxide, a line width of the aluminum pattern decreases by 10% to 30% from the initial line width within 5 minutes.

5. The method of claim 1, wherein the aluminum pattern is a mesh pattern.

* * * * *